(12) United States Patent
Chien et al.

(10) Patent No.: US 9,044,808 B2
(45) Date of Patent: Jun. 2, 2015

(54) SYSTEM AND METHOD FOR PRECISION TRANSPORT, POSITIONING, AND ASSEMBLING OF LONGITUDINAL NANO-STRUCTURES

(75) Inventors: Chia-Ling Chien, Cockeysviile, MD (US); Donglei Fan, San Jose, CA (US); Robert Charles Cammarata, Columbia, MD (US)

(73) Assignee: The Johns Hopkins University, Baltimore, MD (US)

( * ) Notice: Subject to any disclaimer, the term of this patent is extended or adjusted under 35 U.S.C. 154(b) by 834 days.

(21) Appl. No.: 13/147,744

(22) PCT Filed: Mar. 3, 2010

(86) PCT No.: PCT/US2010/026077
§ 371 (c)(1),
(2), (4) Date: Aug. 3, 2011

(87) PCT Pub. No.: WO2010/102024
PCT Pub. Date: Sep. 10, 2010

(65) Prior Publication Data

US 2011/0311791 A1    Dec. 22, 2011
US 2012/0219772 A9    Aug. 30, 2012

Related U.S. Application Data

(60) Provisional application No. 61/175,032, filed on May 3, 2009.

(51) Int. Cl.
*B22F 1/00* (2006.01)
*B82Y 40/00* (2011.01)
(Continued)

(52) U.S. Cl.
CPC .............. *B22F 1/0022* (2013.01); *B82Y 40/00* (2013.01); *B03C 5/005* (2013.01); *B22F 1/0025* (2013.01); *B22F 1/0096* (2013.01); *B82Y 30/00* (2013.01)

(58) Field of Classification Search
CPC ................................ B03C 5/005; B82Y 40/00
USPC .................................. 204/547, 643, 450, 600
See application file for complete search history.

(56) References Cited

U.S. PATENT DOCUMENTS

| 6,536,106 B1 | 3/2003 | Jackson et al. |
| 2004/0134565 A1 | 7/2004 | Sun et al. |
| 2008/0204966 A1 | 8/2008 | Fan et al. |

FOREIGN PATENT DOCUMENTS

| EP | 1612187 A1 | 1/2008 | |
| WO | WO 2008106381 A2 * | 9/2008 | .............. B29C 47/78 |

OTHER PUBLICATIONS

Agarwal et al., "Manipulation and assembly of nanowires with holographic optical traps", *Optical express*, 13, 8906-8912 (2005).
(Continued)

*Primary Examiner* — Alex Noguerola
(74) *Attorney, Agent, or Firm* — Venable LLP; Henry J. Daley

(57) ABSTRACT

A method for assembling multi-component nano-structures that includes dispersing a plurality of nano-structures in a fluid medium, and applying an electric field having an alternating current (AC) component and a direct current (DC) component to the fluid medium containing the plurality of nano-structures. The electric field causes a first nano-structure from the plurality of nano-structures to move to a predetermined position and orientation relative to a second nano-structure of the plurality of nano-structures such that the first and second nano-structures assemble into a multi-component nano-structure.

10 Claims, 10 Drawing Sheets

(51) Int. Cl.
    *B03C 5/00* (2006.01)
    *B82Y 30/00* (2011.01)

(56) References Cited

OTHER PUBLICATIONS

Chen et al., "Tuning the response of magnetic suspensions", *Appl. Phys. Lett.*, 82, 3310-3312 (2003).
Cui et al., "Nanowire Nanosensors for Highly Sensitive and Selective Detection of Biological and Chemical Species", *Science*, 293, 1289-1292, (2001).
Edwards et al., "Electric tweezers: Experimental study of positive dielectrophoresis-based positioning and orientation of a nanorod", *J. Appl. Phy.* 102, 024913-1-024913-5 (2007).
Fan et al., "Manipulation of nanowires in suspension by ac electric fields", *Appl. Phys. Lett.* 85, 4175-4177 (2004).
Hanrath et al., "Nucleation and Growth of Germanium Nanowires Seeded by Organiz Monolayer-Coated Gold Nanocrystals", *J. Am. Chem. Soc.* 124, 1424-1429 (2001).
Holme et al., "Control of Thickness and Orientation of Solution-Grown Silicon Nanowires", *Science*, 287, 1471-1473 (2000).
Huang et al., "Room-Temperature Ultraviolet Nanowires Nanolasers", *Science*, 292, 1897-1899, (2001).
Huang et al., "Logic Gates and Computation from Assembled Nanowire Building Blocks", *Science*, 294, 1313-1317 (2001).
Kind et al., "Nanowire Ultraviolet Photodetectors and Optical Switches", *Adv. Mater.* 14, 158-160 (2002).
Link et al., "Spectral Properties and Relaxation Dynamics of Surface Plasmon Electronic Oscillations in Gold and Silver Nanodots and Nanorods", *J. Phys. Chem. B*, 103, 8410-8426 (1999).
Lu et al., "Growth of Single Crystal Silicon Nanowires in Supercitical Solution from Tethered Gold Particles on a Silicon Substrate", *Nano Lett.* 3, 93-99 (2003).
Nicewarner-Pena, et al., "Submicrometer Metallic Barcodes", *Science*, 294, 137-141, (2001).
Robbie et al., "Sculptured thin films and glancing angle deposition: Growth mechanics and applications", *J. Vac. Sci. Tech. A.* 15, 1460-1465 (1997).
Tanase et al., "Magnetic Alignment of Fluorescent Nanowires", *Nano Lett.*, 1, 155-158 (2001).
Whitney et al., "Fabrication and Magnetic Properties of Arrays of Metallic Nanowires", *Science* 261, 1316-1319 (1993).
Wijnhoven et al., "Preparation of Photonic Crystals made of Air Spheres in Titania", *Science*, 281, 802-804, (1998).
Wong, et al., "Nanobeam Mechanics: Elasticity, Strength, and Toughness of Nanoros and Nanotubes", *Science*, 277, 1971-1975 (1997).
Zhang et al., "Electronics transport properties of single-crystal bismuth nanowires arrays", *Phys. Rev. B.* 61, 4850-4861 (2000).
Zhu et al., "Intermediate Nonlinear Evolution of the Park Instability: Formation of Convection-Induced Discontinuities and Absence of Finite-Time Singularities", *Phys. Rev. Lett.* 96, 065001-1-065001-4, 27205 (2006).
International Search Report for PCT/US2010/026077.

\* cited by examiner

SYSTEM AND METHOD FOR PRECISION TRANSPORT, POSITIONING, AND ASSEMBLING OF LONGITUDINAL NANO-STRUCTURES

CROSS-REFERENCE OF RELATED APPLICATION

This application claims priority to U.S. Provisional Application No. 61/157,032 filed Mar. 3, 2009, the entire contents of which are hereby incorporated by reference, and is a U.S. national stage application under 35 U.S.C. §371 of PCT/US2010/026077, filed Mar. 3, 2010, the entire contents of which are incorporated herein by reference.

The U.S. Government has a paid-up license in this invention and the right in limited circumstances to require the patent owner to license others on reasonable terms as provided for by the terms of Grant No. DMR04-03849 awarded by the National Science Foundation.

BACKGROUND

1. Field of Invention

The current invention relates to methods and systems for assembling multi-component nano-structures and novel multi-component nano-structures.

2. Discussion of Related Art

The study of nano-materials often includes fabrication, characterization, and applications of the nano-structures. A vast variety of nano-structures made of metallic, semiconductive, magnetic, and polymer materials have been fabricated into 0D dots (S. Link and M. A. El-Sayed, *J. Phys. Chem. B*, 103, 8410 (1999)), rings, 1D wires/tubes (F. Q. Zhu, G. W. Chem, O. Tchernyshyov, X. C. Zhu, J. G. Zhu and C. L. Chien, *Phys. Rev. Lett.* 96, 27205 (2006)), 2D films (K. Robbie and M. J. Brett, *J. Vac. Sci. Tech. A.* 15, 1460 (1997)), and 3D architectures (J. E. G. J. Wijnhoven and W. L. Vos, *Science*, 281, 802, (1998)).

Among them, 1D nano-structured wires/tubes have become the focus of recent research. Extensive work reveals that nano-wires and nano-tubes have unique electronic (Z. Zhang, X. Sun, M.S. Dresselhaus and J.Y.Ying, *Phys. Rev. B.* 61, 4850 (2000)), optical (X. Lu, T. Hanrath, K. P. Johnston and B. A. Korgel, *Nano Lett.* 3, 93 (2003). T. T. Hanrath and B.A . Korgel, *J. Am. Chem. Soc.* 124, 1424 (2001). J. D. Holme, K. P. Johnston, R. C. Doty and B. A. Korgel, *Science*, 287, 1471 (2000)), magnetic (T. M. Whitney, J. S. Jiang, P. C. Searson, and C. L. Chien, *Science* 261, 1316 (1993)), and mechanical properties (E. W. Wong, P. E. Sheehan and C. M. Lieber, *Science*, 277, 1971 (1997)), owing to the quantum confinement effect and large surface area.

Even though device prototypes made of nano-wires and nano-tubes have been demonstrated, such as logic units (Y. Huang, X. Duan, Y. Cui, L.J. Lauhon, K.-H. Kim and C. M. Lieber, *Science*, 294, 1313 (2001)) in microchips, nano-lasers (M. Huang, S. Mao, H. Feick,d H. Yan, Y. Wu, H. Kind, E. Weber, R. Russo and P. Yang, *Science*, 292, 1897, (2001)), optical switches (H. Kind and H. Yan and M. Law and B. Messer and P. Yang, *Adv. Mater.* 14, 158 (2002)), and sensors for cellular and molecular diagnosis (S. R. Nicewarner-Pena, R. G. Freema, B. D. Reiss, L. He, D. J. Pena, D. Walton, R. Cromer, C. D. Keating and M. J. Natan, *Science*, 294, 137, (2001). Y. Cui and Q. Wei and H. Park and C. M. Lieber, *Science*, 293, 1289, (2001)), the application of nano-wires as technologically useful materials has been greatly hindered by the difficulties in precision handling of nano-wires.

To date, nano-wires containing magnetic segments have been aligned by applying external magnetic fields using electromagnets or permanent magnets over centimeter lengths (M. Chen, L. Sun, J. E. Bonevich, D. H. Reich, C. L. Chien, and P. C. Searson, *Appl. Phys. Lett.*, 82, 3310 (2003). M. Tanase, L. A. Bauer, A. Hultgren, D. M. Silevitch, L. Sun, D. H. Reich, P. C. Searson, and G. J. Meyer, *Nano Lett.*, 1, 155 (2001)). A magnetic segment is incorporated into the nano-wires to achieve the alignment. Because the magnetic force is a weak force, it is difficult to induce any motion on nano-wires. More recently, holographic optical traps have been used to manipulate semiconductive nano-wires (R. Agarwal, K. Ladavac, Y. Roichman, G. Yu, C. M. Lieber, D. Grier, *Optical express*, 13, 8906 (2005)). The efficiency, however, is quite low because only several nano-wires can be manipulated at a time. Elaborate instrumentations are also required. Dielectrophoretic force induced by AC electric fields has been used to transport nano-wires and nano-tubes (D. L. Fan, F. Q. Zhu, R. C. Cammarata and C. L. Chien, *Appl. Phys. Lett.* 85, 4175 (2004); B. Edwardsa, N. Engheta, S. Evoy, *J. Appl. Phy.* 102, 024913 (2007)). However, the direction, velocity, or t rajectory cannot be controlled without extremely complicated electronic design and computer programming. Thus, there is a need in the art for improved methods and systems for precision manipulation of nano-structures.

SUMMARY

Some embodiments of the current invention provide a method for assembling multi-component nano-structures that includes dispersing a plurality of nano-structures in a fluid medium, and applying an electric field having an alternating current (AC) component and a direct current (DC) component to the fluid medium containing the plurality of nano-structures. The electric field causes a first nano-structure from the plurality of nano-structures to move to a predetermined position and orientation relative to a second nano-structure of the plurality of nano-structures such that the first and second nano-structures assemble into a multi-component nano-structure.

Some embodiments of the current invention provide a system for assembling multi-component nano-structures that includes a sample holder defining a sample chamber therein, the sample chamber being suitable to hold a fluid having a plurality of nano-structures suspended in the fluid; first and second electrodes spaced apart with the s ample chamber arranged between them; a voltage source electrically connected to the first and second electrodes; and a voltage controller in communication with the voltage source. The voltage source is suitable to provide a combined DC voltage and AC voltage in response to the voltage controller to cause a nano-structure of the plurality of nano-structures to become oriented in a predetermined orientation and to move to a predetermined position.

Some embodiments of the current invention include novel multi-component nano-structures. A multi-component nano-structure comprises a first nano-structure having a first magnetic segment; and a second nano-structure having a second magnetic segment. The first and second nano-structures form a multi-component nano-structure via an interaction of the first and second magnetic segments.

BRIEF DESCRIPTION OF THE DRAWINGS

Further objectives and advantages will become apparent from a consideration of the description, drawings, and examples.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited herein are incorporated by reference as if each had been individually incorporated.

Figure 1A:
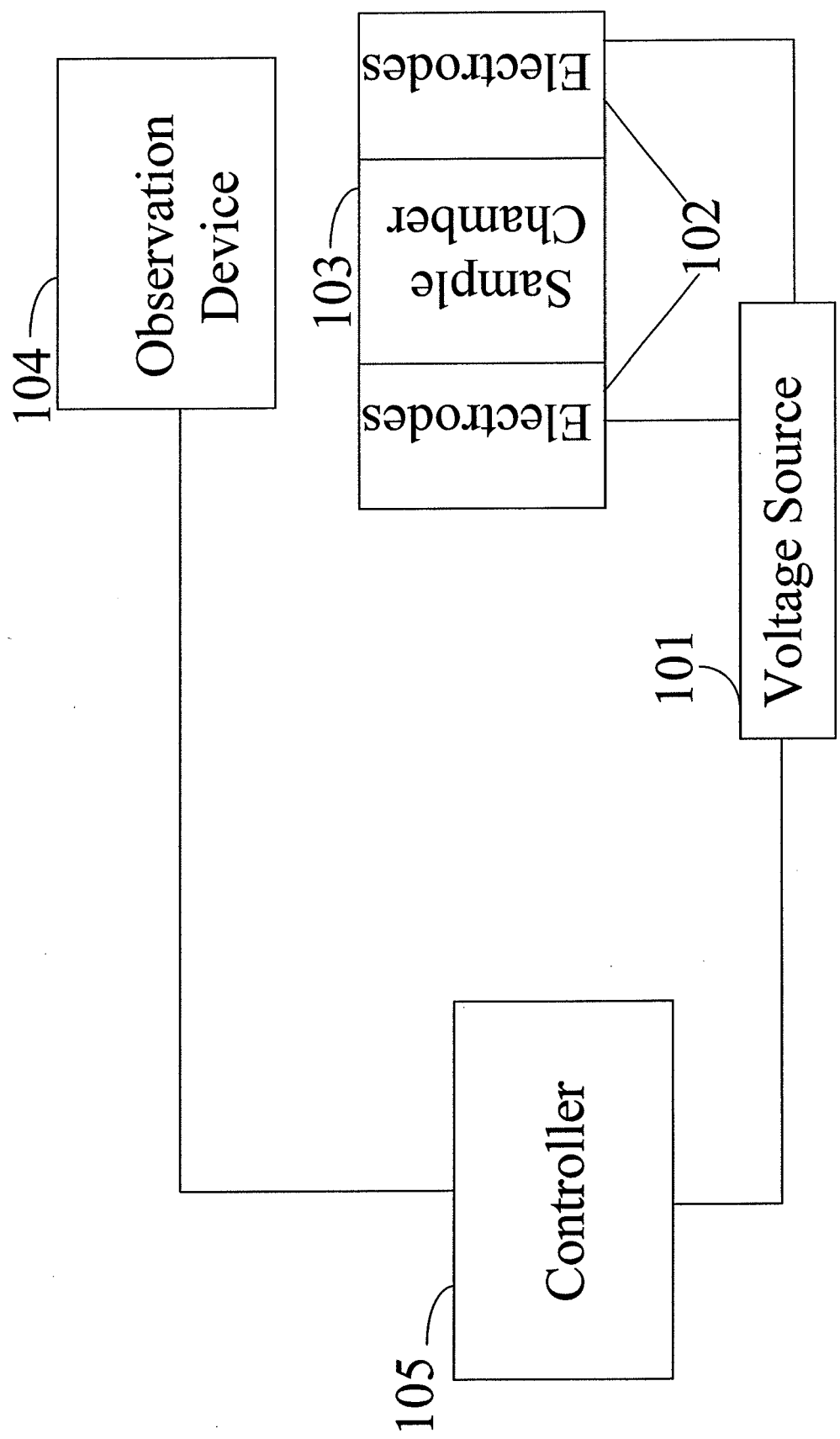
FIG. 1A is a schematic illustration of a system for transporting, positioning, and assembling nano-structures according to some embodiments of the current invention.

FIG. 1A shows a system for transporting, positioning, and assembling nano-structures according to some embodiments of the invention. The term nano-structure is intended to structures that have at least one dimension that is smaller than 1 μm. This includes structures in which all dimensions are less than 100 nm, but it is not limited to only such structures. In some embodiments, the nano-structures may have a longitudinal dimension of less than 100 μm and a lateral dimension of between 2 nm and 400 nm. In some embodiments, the nano-structures may have a longitudinal dimension of less than 30 μm and a lateral dimension of between 5 nm and 400 nm. In some embodiments, the nano-structures may have a longitudinal dimension of less than 1 82 m and a lateral dimension of between 5 nm and 100 nm. Generally, as long as the nano-structure has an asymmetry such that one dimension is longer than the other two and it is sufficiently small to disperse in fluid, such as de-ionized water, for a long enough time to be assembled, this system can be useful. The nano-structures can be, for example, nano-wires, nano-fibers, nano-tubes, nano-spheres, nano-disks, nano-plates, nano-cubes, nano-cylinders, and variants thereof. The nanostructures can also be attached to macrostructures in some embodiments and/or to nano-structures that are integral or attached to a macrostructure. For example, nano-pillars, nano-spheres, nano-cubes that are attached to or integral with a substrate can be included in assembly processes according to some embodiments of the current invention.

A voltage source 101 provides a voltage to electrodes 102. The voltage source can apply both a direct current (DC) and alternating current (AC) voltage. The electrodes can be less than 1 mm in length, for example, in some embodiments. The electrodes can be microelectrodes in some embodiments, but they are not limited to microelectrodes in all applications. The pair of electrodes 102 are spaced around a sample chamber 103 that is suitable to hold a fluid medium containing nano-structures in suspension. The voltage applied on the electrodes 102 induces an electric field that encompasses the nano-structures in suspension. The electric field causes positional and orientational changes of the nano-structures. One, two, or three pairs of electrodes may be spaced around sample chamber 103 to provide a suitable electric field in the sample chamber 103 to manipulate suspended nano-structures in a two-dimensional plane or a three-dimensional volume. The electrodes may be constructed on a substrate by, for example, lithography. De-ionized water has been found to be a suitable fluid medium for use in fluid chamber 103 according to some embodiments of the current invention. Sample chamber 103 can be less than 1 mm in length in some embodiments. The electrodes 102 and the sample chamber 103 can also together form a sample holder according to some embodiments of the current invention.

An observation device 104 is arranged to monitor positions of the nano-structures in the sample chamber 103. To track the positions of nano-structures, the observation device 104 may comprise at least one of a microscope, an imaging device, such as a charge-coupled device (CCD) camera, an infra-red camera, or a radiation detector. The nano-structures can be tagged with, for example, relevant fluorescent, infra-red or radioactive markers in some embodiments, but is not required in all cases. Observation device 104 may be further adapted to recognize changed positions and orientations of the nano-structures and to provide data encoding the changed positions and/or orientations. When three pairs of electrodes provide an electric field to manipulate the nano-structures in three dimensions, at least one electrode can be transparent in an operating wavelength of observation device 104.

A controller 105 is in communication with observation device 104 to receive information representing the positions and orientations of the nano-structures. Controller 105 is also in communication with voltage source 101. Controller 105 is configured to control a parameter of the voltage that can cause the nano-structures to change positions or orientations in the fluid medium of sample chamber 103. The parameter can be amplitude, frequency, phase, or duty cycle of the applied voltages, or variations thereof. Controller 105 can also be further configured to adjust the parameter of the voltage based on data from observation device 104 to take into account the changed positions and/or orientations of the nano-structures in real time according to some embodiments of the current invention. The controller 105 can be a computer having a processor, a memory, a display device, and an input device according to some embodiments of the current invention. The display device can be, for example, a cathode ray tube (CRT) monitor, a liquid crystal display (LCD) monitor, a digital light projection (DLP) monitor, a projector display, a laser projector, a plasma screen, an organic light emitting diode (OLED), etc. The input device can be, for example, a keyboard, a mouse, a touch screen, a joy-stick, etc. However, the display and input devices are not limited to these particular examples. They can include other existing or future developed display and input devices without departing from the scope of the current invention.

Figure 1B:
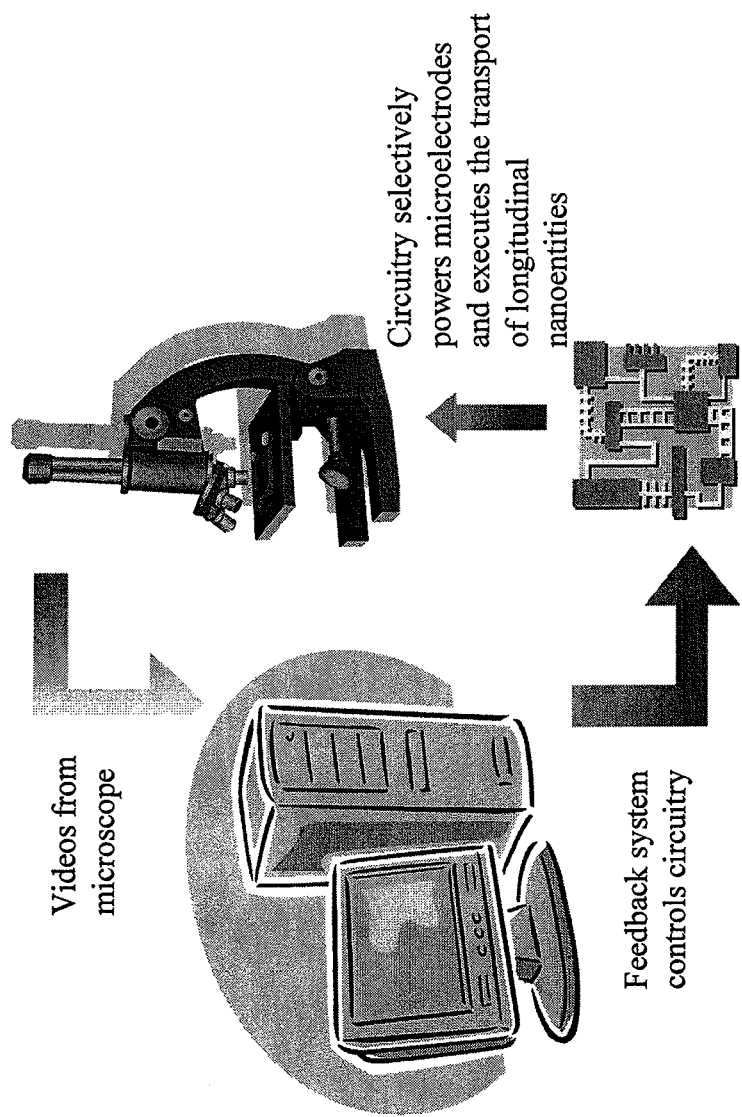
FIG. 1B is a schematic illustration of a computer controlled system for transporting, positioning and assembling nano-structures according to an embodiment of the current invention.

FIG. 1B shows a computer controlled system for transporting, positioning, and assembling longitudinal nano-structures according to an embodiment of the current invention. Computer-controllable electric circuitry can selectively power the electrodes 102 in this embodiment. The circuitry is one embodiment of voltage source 101. An optical microscope coupled to a video camera (e.g., a CCD camera) may be used to capture the motion of the nano-structures in the horizontal plane for subsequent analysis of their motion. The optical microscope coupled to a video camera is one embodiment of observation device 104. When three pairs of electrodes provide an electric field to manipulate the nano-structures in three dimensions, one of the microelectrodes may be substantially transparent within an operating wavelength of the microscope and the video camera to facilitate inspection of nano-structures in sample chamber 103. In some embodiments, a computer program on the computer may recognize the positions, orientations, trajectories, and velocities of longitudinal nano-structures being monitored. The computer running the computer program may direct the circuitry to selectively apply the voltages on the electrodes 102 to transport nano-structures to designated positions and orientations. The computer is only one example of an embodiment of controller 105.

Figure 2:
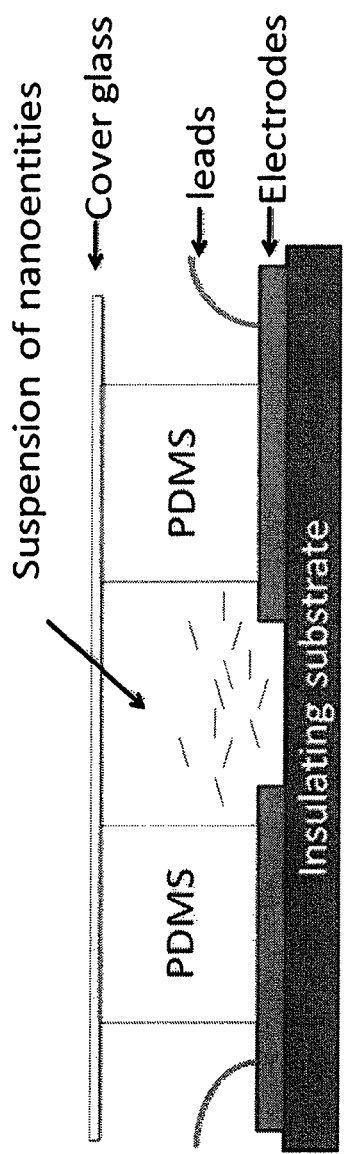
FIG. 2 is a schematic illustration of a microchip for precision manipulation of nano-structures according to an embodiment of the current invention.

FIG. 2 is a schematic illustration of a microchip for precision manipulation of nano-structures according to some embodiments of the current invention. In this example, the microchip includes electrodes and a sample chamber combined into the combined structure. The microchip includes a glass substrate in this example. The broad concepts of the invention are not limited to a particular material of the substrate. Some suitable materials may include, for example, quartz, glass, silicon, selenium, GaAs, ZnO, polymer, etc. Two pairs of parallel microelectrodes (each electrode has a dimension of 480 µm ×480 µm) may be constructed on an insulating substrate via lithographic methods. Once energized with a voltage, an electric field is generated between the microelectrodes. A polydimethylsiloxane (PDMS) elastomer well 5 mm in diameter and 5 mm in thickness may be firmly attached on top of the microelectrodes. The well may hold a non-ionized fluid medium in which nano-structures are suspended. The well can be covered by a piece of glass slide, for example, to prevent water evaporation. The transparent glass cover may enable the motion of the nano-structures to be visualized by, for example, an optical microscope coupled to a video camera.

Nano-structures suspended in a liquid such as water typically absorb ions from the liquid and, as a result, usually carry charges. The absorbed ions can be positive or negative, depending on the fluid, the material of the nano-structure, the pH value, the type and concentration of salt in the fluid.

The surface of the nano-structures can also be charged by chemical modifications. For example, the surface of the nano-structures can be modified by molecules with one end attached to the nano-structures and the other end carry charges when ionized in a liquid. For demonstration purpose, Au nano-wires have been surface modified by thiol-conjugation. Molecules with thiol group (—SH) at one end and carboxyl group (—COOH) or amino group (—NH$_2$) at the other end are conjugated on the surface of Au nano-wires. After suspension in de-ionized (DI) water, the carboxyl group (-COOH) may be ionized to become COO$^-$, and the amino group (—NH$_2$) may be ionized to become —NH$^{3+}$. Thus, the nano-wires surface terminated by the carboxyl group (-COOH) are negatively charged in DI water. Those terminated by the amino group (—NH$_2$) are positively charged in DI water.

When a charged nano-structure is exposed to an electric field, the nano-structure experiences a force resulting from a coulomb interaction between the electric field and the charge. This force is called electrophoretic force (EP) for particles suspended in a liquid. The EP force is characterized as:

$$\vec{F}_{EP}=q\vec{E} \quad (1).$$

The particle is driven by the EP force to move at a constant terminal velocity $\vec{v}$ determined by the viscous force of the liquid:

$$q\vec{E}=K\eta\vec{v} \quad (2),$$

where q is the total charges on the surface of the particle, $\vec{E}$ is the electric field strength, K is the stokes shape factor of the particle, and $\eta$ is the viscosity of the liquid. The EP force can therefore drive charged nano-structures suspended in liquids into motion.

The dielectrophoretic (DEP) force is the force a charge-neutral nano-structure experiences in an AC electric field due to an interaction between the AC field and the polarization of the nano-structure causing an induced electrical dipole moment. Theoretically, DEP force works for both DC and AC electric fields. Practically, however, most DEP phenomena are studied at high frequency electric fields (>100 Hz) to circumvent the screening effect by water which has a large dielectric constant of 80, thus reducing the DEP force by a factor of 6400. The DEP force can align, for example, nano-wires in the direction of the electric field, and transport the nano-wires to the spatial location of the largest electric field gradient.

If a uniform AC electric field with no applied gradient, the DEP force would only align but would not transport the nano-structures. This feature provides us with the possibility of using a uniform AC electric field to align the nano-structures and a uniform DC electric field to transport the charged nano-structures independently.

Figure 3:
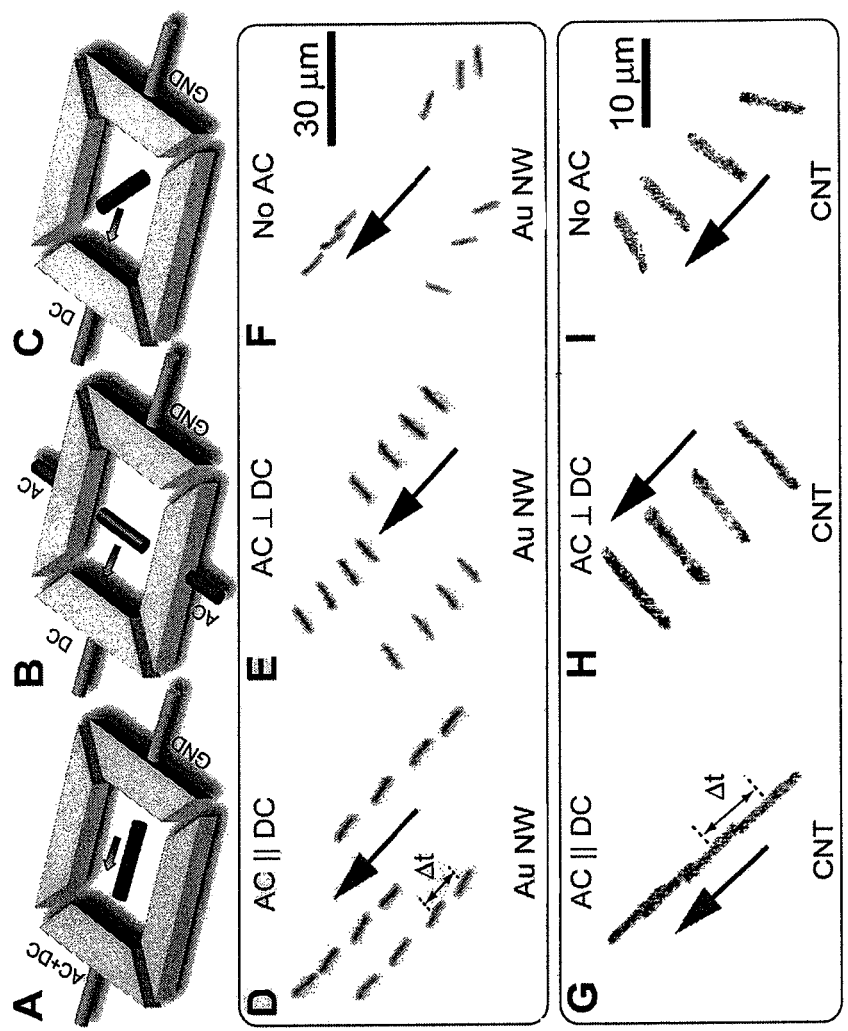
FIG. 3 is a schematic illustration of various voltage configurations on quadruple electrodes and the respective effects on moving nano-structures according to an embodiment of the current invention.

FIG. 3 shows schematics of various voltage combinations provided to a quadruple electrode and the respective effects on transporting nano-structures in suspension. Different combinations of alternating current (AC) and direct current (DC) electric field components may affect the motions of nano-structures differently. For example, when the AC and DC electric field components are parallel in direction (FIG. 3A), the nano-structures may be moving with their longitudinal dimension parallel to the direction of the AC and DC electric field, as shown in FIGS. 3D and 3G for Au nano-wires and carbon nano-tubes, respectively. When the AC and DC electric field components are perpendicular in direction (FIG. 3B), the nano-structures move with their longitudinal dimension perpendicular to the DC electric field direction and parallel to the AC electric field direction, as shown in FIGS. 3E and 3H for Au nano-wires and carbon nano-tubes, respectively. When only the DC electric field is present (FIG. 3C), the nano-structures move along a trajectory with their longitudinal dimension in random orientations, as shown in FIGS. 3F and 3I for Au nano-wires and carbon nano-tubes, respectively. FIG. 3 shows that the AC electric field can accurately control the orientation of the nano-structures, independent of the motion. FIG. 3 also shows that both nano-wires (150 nm in radius) and multi-wall nano-tubes (10~25 nm in radius) can be manipulated in suspension.

Nano-structures in suspension may be placed in the center region of the quadruple electrodes. The nano-structures can be maintained there for approximately 20 seconds to settle, before voltages are applied to the electrodes. The AC voltages can be from 2 V to 8 V, with a frequency from 10 MHz to 50 MHz in some applications of the current invention. DC voltages can be between 1 V to 2.5 V, for example. The DC voltages can be chosen to be below 3 V to avoid electrohydrolysis of water.

Further, the nano-structures can be manipulated in three dimensions. In addition to the quadruple electrodes on the substrate, another pair of electrodes can be added perpendicular to the substrate to provide the electric field in the third dimension. Thus, the nano-wires can be manipulated with all the versatilities described above and in three dimensions.

Figures 4A, 4B:
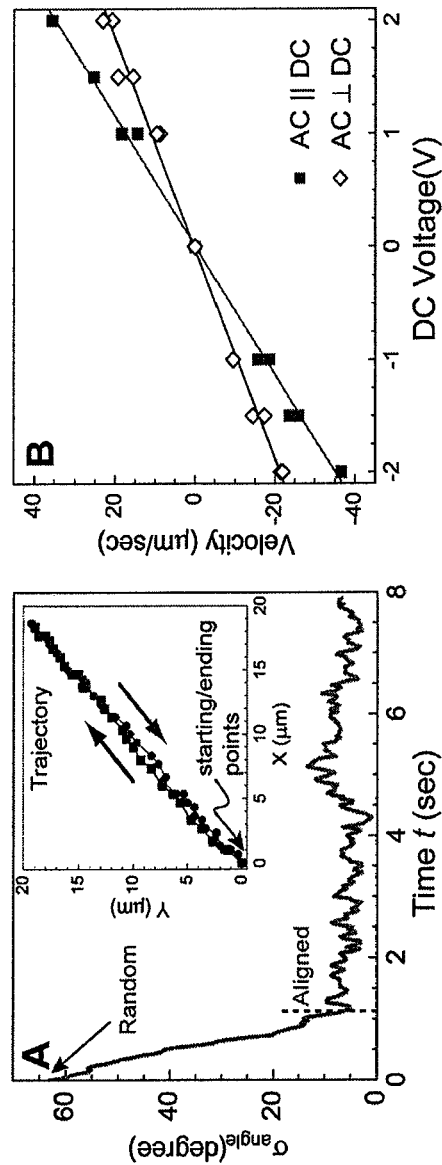
FIG. 4A shows the characterization of the alignment rate of nano-wires in an alternating current (AC) electric field according to some embodiments of the current invention.
FIG. 4B shows the measured velocity of nano-wires as a function of applied direct current (DC) voltages according to some embodiments of the current invention.

FIG. 4A shows the characterization of the alignment rate of nano-wires in an alternate current (AC) electric field according to some embodiments of the current invention. The angles between the longitudinal dimension of the nano-wires and the trajectories of their motion in the electric field were measured. The time dependence of the standard deviation of angle ($\sigma_{angle}$) among all nano-wires in the video are displayed in FIG. 4A. The uniform AC electric field was turned on at t=0. The value of $\sigma_{angle}$, decreases rapidly from about 60° (in the random arrangement) to about 5°, approximately 1 second after the uniform electric field has been turned on and remains so. For the translational motion, the nano-wires moved in a linear trajectory in the direction of the DC electric field as shown in the inset of FIG. 4A. When the direction of the DC electric field was reversed, the nano-wires reversed their motion and retraced the previous trajectories as shown in FIG. 4A.

FIG. 4B shows the measured velocity of nano-wires as a function of applied direct current (DC) voltages. The velocity of nano-wires should increase linearly with the strength of the DC electric field according to the relation of v=qE/Kη, where the electric field E is proportional to the applied voltage V for a fixed electrode configuration. Experimentally, the terminal velocity of the Au nano-wires has been confirmed to be proportional to V. This result is shown in FIG. 4B for both longitudinal and transverse motion of negatively charged Au nano-wires. The terminal speed reached can be as much as 40 μm/s; a very high speed in the microscopic world. The difference in the speeds for longitudinal and the transverse motion, shown in FIG. 4B, indicates that the viscous force may depend on the orientations of the nano-structures.

Figure 5:
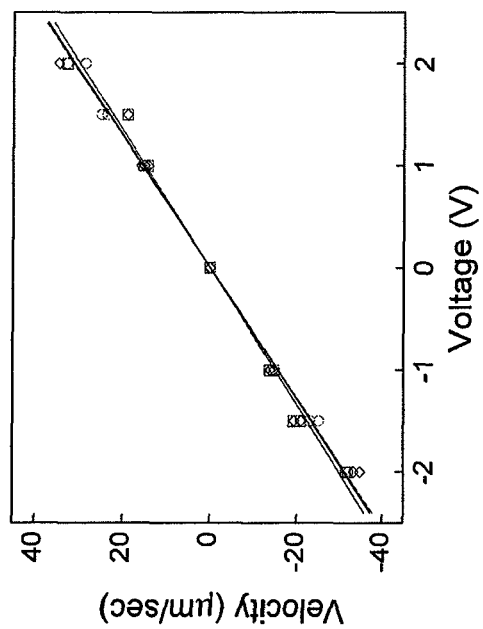
FIG. 5 shows the measured velocity of multi-wall carbon nano-tubes as a function of applied DC voltages according to some embodiments of the current invention.

FIG. 5 shows the measured velocity of multi-wall carbon nano-tubes (MWCNTs) as a function of applied DC voltages. The velocities were measured from MWCNTs (10~25 nm in radius) suspended in DI water (shown in FIGS. 3G-3I). The plot using squares is from measured positional data of transporting MWCNTs with parallel AC and DC field components. The plot using dots is from measured positional data of transporting MWCNTs with perpendicular AC and DC field components. The plot using circles is from measuring positional data of transporting MWCNTs with only DC field components. The moving velocities are linearly proportional to the applied DC voltages, similar to the proportionality seen in FIG. 4B for nano-wires. Because of the smaller size of MWCNT, the orientation dependence of the viscous force may be less pronounced.

Figure 6:
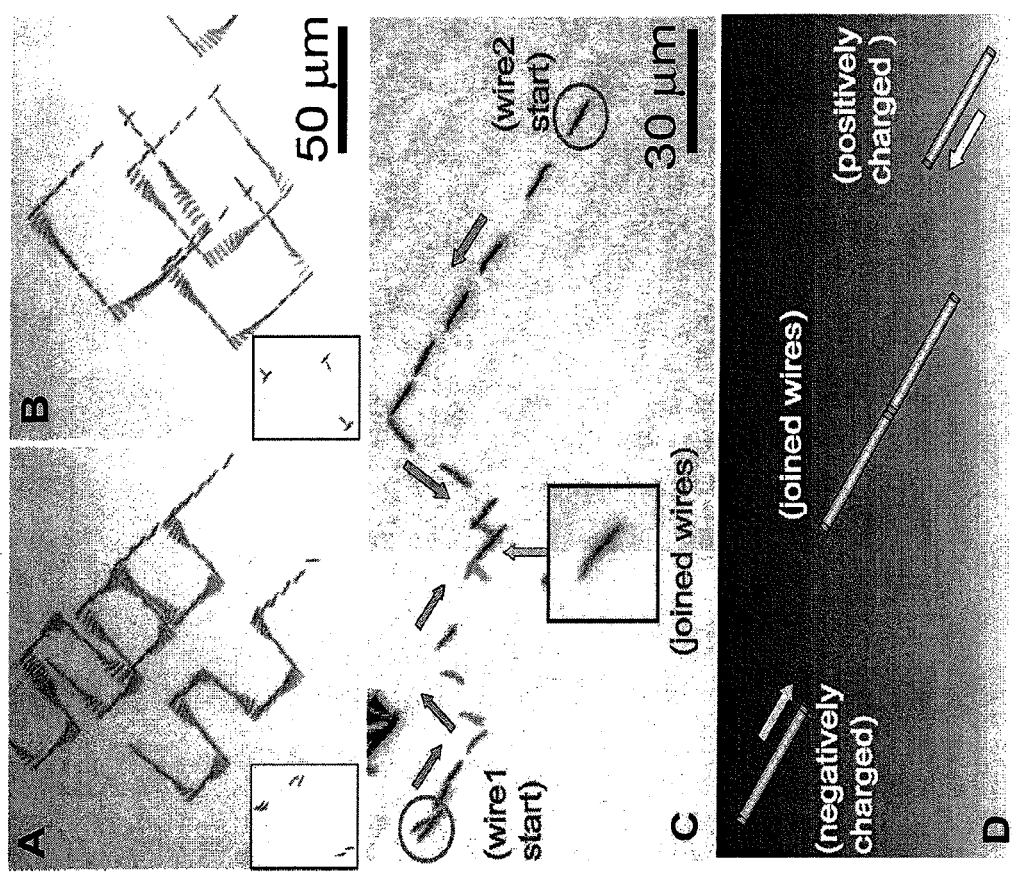
FIG. 6 shows example trajectories of nano-structures being manipulated according to some embodiments of the current invention.

Having demonstrated that charged nano-wires can be moved along a straight line with specific speed and orientation, both forward and backward, FIG. 6 shows this manipulation can be extended to two dimensions by using two pairs of parallel electrodes, such as shown in FIG. 3, to control the motion and the orientation along the two orthogonal directions. A single nano-wire can be moved from any initial location at the coordinate of $(X_i, Y_i)$ to any final location at the coordinate of $(X_f, Y_f)$ by supplying a series of voltages with certain durations so that the nano-wire can be moved with a net distance of $X_f - X_i$ and $Y_f - Y_i$ in the two directions. The sequence of these voltage pulses can be mixed to provide many different paths connecting the two locations. The path can even include curved trajectories when small voltage step sizes are being used.

In FIG. 6A, several nano-wires were moved from their initial locations to the final locations and back to the initial locations following zigzag paths comprising straight segments along the X and Y axes. In FIG. 6B, the nano-wires were moved in the trajectory of squares, both clockwise and counterclockwise, by a programmed application of voltages provided to the microelectrodes. The nano-wires were transported with their longitudinal dimension aligned with the direction of the transport. As soon as the spatial orientation of the AC electric field was turned 90°, the orientation of the nano-wires followed within about 1 second in response. When all the nano-wires had been driven back to the original locations, after traveling hundreds of micrometers, they were within only a few micrometers from their starting locations as shown in the insets of FIGS. 6A and 6B. This demonstrates the precision of the manipulation is largely limited by the Brownian motion of the nano-wires in suspension. These examples demonstrate that this method can transport and position nano-wires to any location along any prescribed trajectory with sub-micrometer precision.

By using this two-dimensional manipulation technique, two oppositely charged 6-μm-long Au nano-wires in suspension were successfully connected. Two oppositely charged nano-wires were aligned and moved in opposite directions, either away or towards each other depending on the direction of DC electric field. By manually controlling the sequence of voltages supplied to the electrodes, two Au nano-wires carrying opposite charges, initially separated by 185 μm, were moved towards each other, as shown by the overlap images in FIG. 6C, where the two nano-wires were eventually connected tip to tip. The charges on the two nano-wires were unequal with a ratio of about 2 to 1, as can be inferred from the distances traversed by the nano-wires in FIG. 6C. Because the two nano-wires had a radius of only 150 nm, the high precision of the manipulation had been demonstrated.

When the two nano-wires are loosely joined, the Brownian motion will disconnect the two joined Au nano-wires once the electric field is removed. However, the joint can be secured by, for example, a chemical bonding through suitable processing of the surface of the Au nano-wire. Another example of securing the joint is by adding short Ni segments (0.5 μm) at both ends as illustrated schematically in FIG. 6D. Once the electric field has brought the two nano-wires in sufficient proximity, the magnetic attraction between the Ni segments at the ends may securely join the two nano-wires, even after the electric field is turned off.

Nano-wires are promising building blocks for microelectronics. To integrate nano-wires as active elements in circuits, a technique may select nano-wires to serve as transistors or interconnects. Further, the technique may position nano-wires with high precision in controlled alignment. In addition, the technique may dissemble nano-wires on demand to re-configure circuits.

Figure 7:
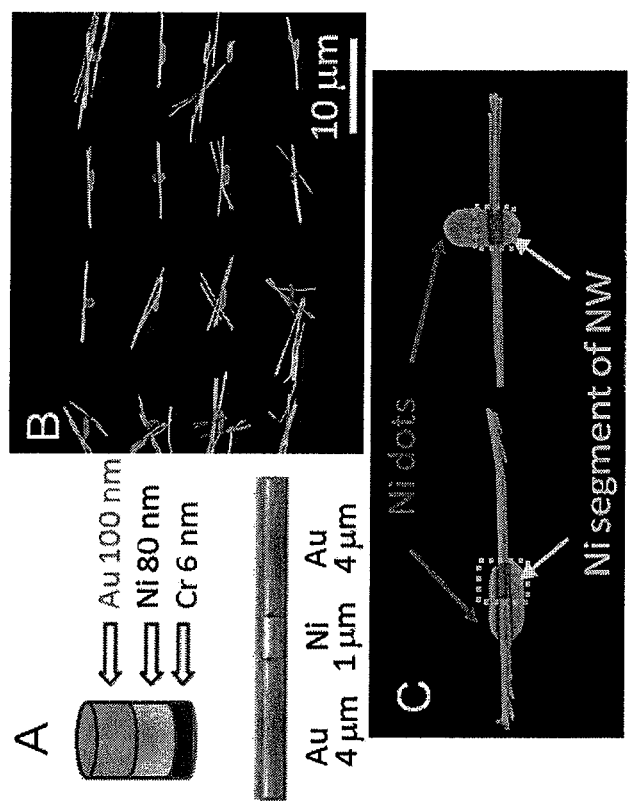
FIG. 7A shows a nano-pillar according to an embodiment of the current invention.
FIG. 7B shows an array of nano-wires mounted on nano-pillars according to an embodiment of the current invention.
FIG. 7C shows a close-up view of two nano-wires mounted on two nano-pillars according to an embodiment of the current invention.

This technique was demonstrated on an array of nano-pillars. Each nano-pillar, as shown in FIG. 7A, was a sandwiched structure integral to a substrate. For example, a Cr layer (bottom) may be the adhesive layer for on the substrate using lithographic techniques. The bottom layer may also become integral to the substrate by other processes without deviating from the general concepts of the current invention. A Ni layer in the middle may provide a magnetic force, and a gold top layer may adjust the magnitude of the magnetic force imposed on top of the nano-pillar.

To magnetize the nano-pillars, an external magnetic field was temporally imposed to and then subsequently removed from the nano-pillars. However, a permanent magnetic segment may also be used. In this example shown in FIG. 7A, Au nano-wires with Ni segments in the middle were electrode-posited. Using the precision manipulation technique, the Au nano-wires were transported and mounted on top of all 16 lithographed nano-pillars, as shown in FIG. 7B. All of the nano-wires preferentially aligned in the direction of the external magnetic field that magnetized the nano-pillars. These assemblies of nano-wires mounted on nano-pillars remained intact even after the evaporation of the fluid medium. A close-up view of the assembled nano-structure is shown in FIG. 7C. The nano-wires were precision positioned such that the Ni segments of nano-wires were flush with the edges of Ni segments of the nano-pillars. The nano-wires may be surface processed to be electrically polarizable, as, for example, electrical dipoles or electrical quadruples.

Figure 8:
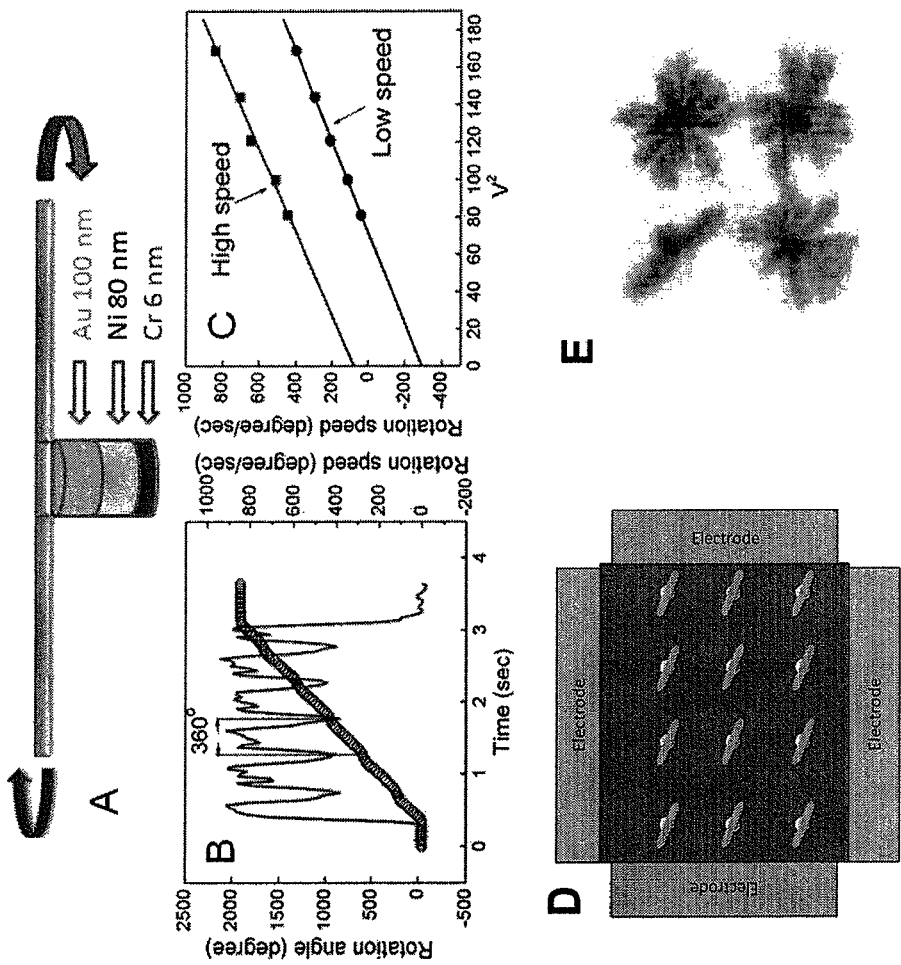
FIG. 8A shows a nano-motor assembled according to an embodiment of the current invention.
FIG. 8B shows the measured rotation angle and angular rotation speed of a nano-motor assembled according to an embodiment of the current invention.
FIG. 8C shows the two measured angular rotation speeds of a nano-motor assembled according to an embodiment of the current invention.
FIG. 8D shows an array of nano-motors assembled according to an embodiment of the current invention.
FIG. 8E shows a 2×2 array of the nano-motors in an induced rotary motion according to some embodiments of the current invention.

Using this technique, nano-wires can be directly integrated into a circuitry of, for example, sensors, detectors, logic units, etc. Heterogeneous nano-wires can be assembled into the same circuitry, some as transistors and some as interconnects. By manipulating the magnetic configuration of nano-magnets to turn the magnetic field from the nano-magnet on and off, the nano-wire circuitry can be disassembled and reconfigured FIG. 8A shows a nano-motor assembled according to an embodiment of the current invention. The magnetic attractions between the magnetic segments in the nano-wires and the nano-pillars serve as the bearings that pivot the rotating nano-wires at fixed positions. Thus, ordered arrays of nano-motors can be assembled.

FIG. 8B shows measured rotation angle and angular rotation speed of the nano-motor of FIG. 8A according to some embodiments of the current invention. The rotation angular speed has two states, a high speed state and a low speed state. The duration of each state is 360 degrees in rotation angle. This is because the magnetic torque in the bearing changes every 360 degrees. In addition, the speeds associated with the high speed and low speed state increase with $V^2$ linearly, as shown in FIG. 8C.

FIG. 8D shows an array of the nano-motors according to an embodiment of the current invention. The positioning of the nano-wires mounted on the nano-pillars c an be precisely controlled by the electric field transport technique. The initial alignment direction of the nano-wires can be controlled by tuning the magnetic orientation in the magnetic bearing.

FIG. 8E shows a 2×2 array of the nano-motors in an induced rotary motion according to an embodiment of the current invention. Overlapped images of the array from a camera (at a frame rate of 0.1 second) demonstrate that 75% of the assembled nano-motors were in successful rotation, indicating a great yielding rate. By precisely tuning the length of the magnetic section in the nano-wires, the diameter and the layer thickness of the magnetic bearings, an improved yield rate of over 90% may be expected. Moreover, a lubricant layer on at least one of the nano-wire and the nano-pillar can decrease friction between the two nano-structures during operation of the nano-motor. The nano-motors according to some embodiments of the current invention can be used in various applications involving MEMS and/or NEMS devices such as microfluidic mixing, microfluidic pumping, fluidic sensing, and chopping light.

The method of rotating a type of nano-motor has been disclosed in PCT patent application No. PCT/US2005/033972, the entire contents are incorporated by reference herein.

Figure 9:
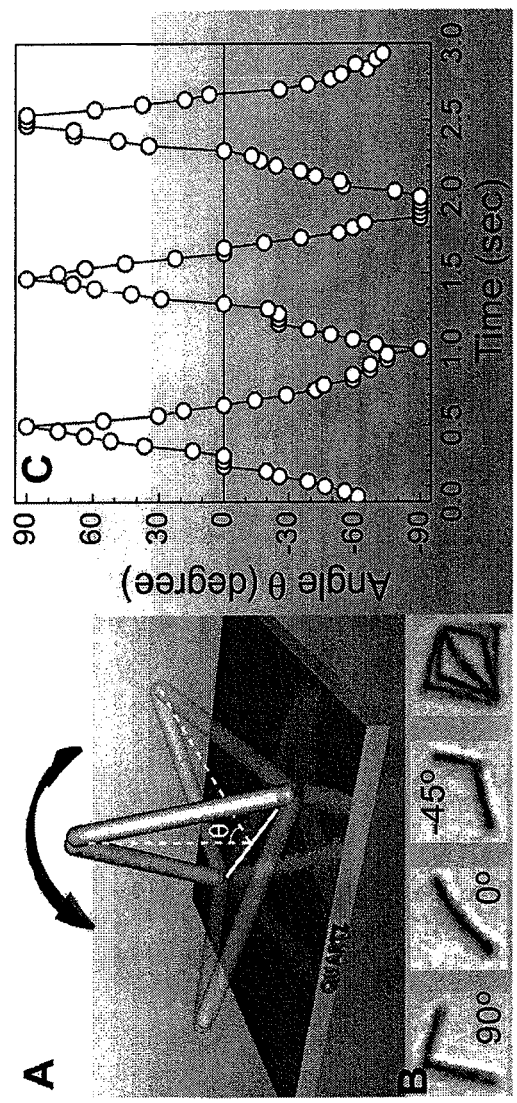
FIG. 9A shows a nano-oscillator assembled according to an embodiment of the current invention.
FIG. 9B shows the assembled nano-oscillator of FIG. 9A at various phases in an oscillatory motion.
FIG. 9C shows the measured oscillation angle of the nano-wire oscillator as a function of time.

Using the manipulation method of the current invention, the nano-wires can be assembled into various NEMS/MEMS devices. FIG. 9A shows a nano-wire oscillator assembled according to an embodiment of the invention. This V-shaped nano-structure was formed by joining two oppositely charged Ni/Au/Ni nano-wires end to end while the other two ends were integral to the quartz substrate by non-covalent bonds between Ni and quartz. This nano-structure with two anchoring points on the substrate can be driven into mechanical oscillations by AC square-wave voltages (1~2.5V). The position of the oscillator, as characterized by the angle between the plane of the oscillator and the normal direction of the substrate surface, can be measured from the projection length of the nano-structure. FIG. 9B shows the photos of the nano-structure at various angles during the oscillation. FIG. 9C reveals the oscillation was at frequencies from 0.5 to 2.5 Hz, identical to that of the AC square wave frequency. These oscillators operated in water and can hence be relevant to biomedical applications. These oscillators have been entirely assembled in situ from individual nano-wires using EP and DEP manipulation.

Thus, a method of precision transport of nano-structures in suspension with sub-micrometer accuracy using a combination of the electrophoretic (EP) force and the dielectrophoretic (DEP) force has been described. Using this method, nano-structures can be efficiently incorporated into devices as active elements for sensors, detectors, and logic units, for example. Nano-wires are also important building blocks for micro/nanoelectromechanical system devices (MEMS/NEMS). Nano-motor and nano-wire oscillators have been assembled by using this precision transport technique. Attaching additional nano-structures to the assembled nano-structures described above may enable more MEMS/NEMS devices. For example, by adding a nano-shaft to the nano-wire micromotor, a MEMS/NEMS device may be assembled that translates a rotational motion into a linear oscillation. It is anticipated that a vast range of multi-component nano-structures can be produced by these methods, many of which have analogies with macroscopic mechanical devices. The broad concepts of the current invention are not limited to the particular examples provided.

In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A method for assembling multi-component nano-structures, comprising:
   dispersing a plurality of nano-structures in a fluid medium;
   applying an electric field having an alternating current (AC) component and a direct current (DC) component to the fluid medium containing the plurality of nano-structures,
   wherein said electric field causes a first nano-structure from said plurality of nano-structures to move to a predetermined position and orientation relative to a second nano-structure of said plurality of nano-structures such that said first and second nano-structures assemble into a multi-component nano-structure, and
   wherein each nano-structure of said plurality of nano-structures has a longitudinal dimension of less than 100 μm and a lateral dimension greater than 2 nm and less than 400 nm.

2. The method of claim 1, wherein said fluid medium consists essentially of de-ionized water.

3. The method of claim 1, wherein each nano-structure of said plurality of nano-structures has a longitudinal dimension of less than 10 μm and a lateral dimension of greater than 5 nm and less than 100 nm.

4. The method of claim 1, further comprising:
   monitoring positions and orientations of said first and second nano-structures during said applying said electric field; and
   changing said electric field based on said monitoring.

5. A method for assembling multi-component nano-structures, comprising:
   dispersing a plurality of nano-structures in a fluid medium;
   applying an electric field having an alternating current (AC) component and a direct current (DC) component to the fluid medium containing the plurality of nano-structures,
   wherein said electric field causes a first nano-structure from said plurality of nano-structures to move to a predetermined position and orientation relative to a second nano-structure of said plurality of nano-structures such that said first and second nano-structures assemble into a multi-component nano-structure, and
   wherein said second nano-structure is integrally connected to a substrate.

6. The method of claim 5, wherein said first and second nano-structures each have a section of a magnetic material.

7. The method of claim 6, wherein said first nano-structure and second nano-structure assemble into said multi-component nano-structure through a magnetic interaction of said sections of magnetic material.

8. The method of claim 5, further comprising applying a magnetic field to selectively orient magnetic poles of said first nano-structure relative to magnetic poles of said second nano-structure.

9. A method for assembling multi-component nano-structures, comprising:
   dispersing a plurality of nano-structures in a fluid medium;
   applying an electric field having an alternating current (AC) component and a direct current (DC) component to the fluid medium containing the plurality of nano-structures; and
   surface processing said first nano-structure to cause said first nano-structure to be at least one of electrically charged, electrically polarized or electrically polarizable,
   wherein said electric field causes a first nano-structure from said plurality of nano-structures to move to a predetermined position and orientation relative to a second nano-structure of said plurality of nano-structures such that said first and second nano-structures assemble into a multi-component nano-structure.

10. The method of claim 9, wherein said surface processing comprises conjugating at least one of a thiol group, a carboxyl group, an amino group, or equivalents thereof.

* * * * *